(12) United States Patent
Kanjanavikat

(10) Patent No.: US 6,457,224 B1
(45) Date of Patent: Oct. 1, 2002

(54) DAMBAR PUNCH SETUP JIG

(75) Inventor: Adisorn Kanjanavikat, Bangkok (TH)

(73) Assignee: Advanced Micro Devices, Inc., Sunnyvale, CA (US)

( * ) Notice: Subject to any disclaimer, the term of this patent is extended or adjusted under 35 U.S.C. 154(b) by 4 days.

(21) Appl. No.: 09/642,999

(22) Filed: Aug. 21, 2000

(51) Int. Cl.⁷ .................................................. B23Q 3/00
(52) U.S. Cl. ........................ 29/464; 29/426.1; 29/281.5; 83/687; 83/691
(58) Field of Search .................... 29/426.1, 428, 29/464, 465, 525, 281.5; 83/687, 691, 698.11, 698.71, 699.11, 954

(56) References Cited

U.S. PATENT DOCUMENTS

| | | | |
|---|---|---|---|
| 4,102,043 A | * | 7/1978 | Andrade et al. ............... 29/739 |
| 4,513,498 A | * | 4/1985 | Kent ............................ 29/845 |
| 4,669,171 A | * | 6/1987 | Card et al. ..................... 29/446 |
| 4,741,090 A | * | 5/1988 | Monnier ....................... 29/464 |
| 5,054,188 A | | 10/1991 | Sabado |
| 5,098,863 A | | 3/1992 | Dolezal et al. |
| 5,178,051 A | * | 1/1993 | Smith et al. .................. 83/685 |
| 5,271,148 A | | 12/1993 | Desrochers et al. |
| 5,452,635 A | * | 9/1995 | Ong ............................. 83/133 |
| 5,495,780 A | | 3/1996 | Ong |
| 5,497,681 A | | 3/1996 | Ong |
| 5,554,886 A | | 9/1996 | Song |
| 5,753,532 A | | 5/1998 | Sim |
| 5,877,542 A | | 3/1999 | Ohuchi |
| 6,269,723 B1 | * | 8/2001 | Ong ............................. 83/687 |

FOREIGN PATENT DOCUMENTS

JP 60096442 * 5/1985 ................... 29/464

* cited by examiner

Primary Examiner—S. Thomas Hughes
Assistant Examiner—Essama Omgba
(74) Attorney, Agent, or Firm—Amin & Turocy, LLP

(57) ABSTRACT

The invention provides a device, a dambar punch setup jig, which permits dambar punches to be rapidly installed in a dambar punch housing. The dambar punches are placed on the dambar punch setup jig, where their positions are fixed relative to one another. The dambar punches may be held in place on the dambar punch setup jig by a cover. Once installed in the dambar punch setup jig, the dambar punches can be simultaneously installed in the dambar punch housing. The dambar punch setup jig may then be removed, leaving the dambar punches installed in the dambar punch housing. The dambar punches are easier to install in the dambar punch setup jig then in the dambar punch housing, saving operator time. Using the jig substantially reduces the equipment downtime required to replace the dambar punches. The jig may also be used to remove dambar punches from the dambar punch housing.

12 Claims, 4 Drawing Sheets

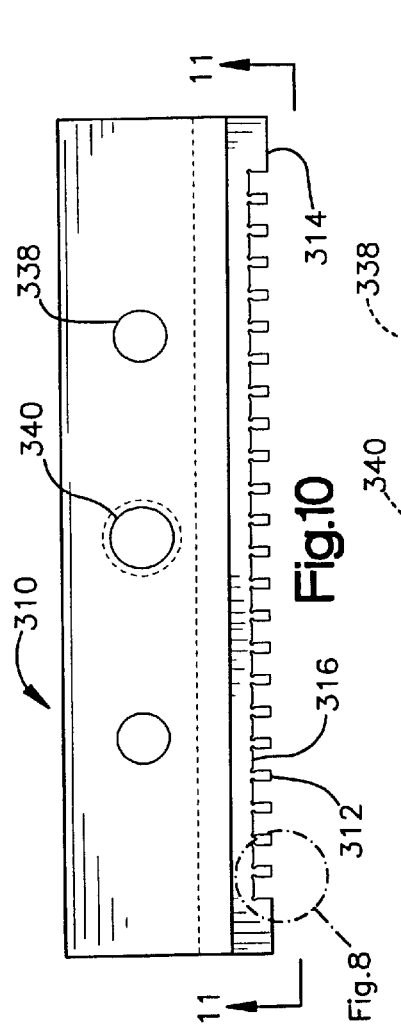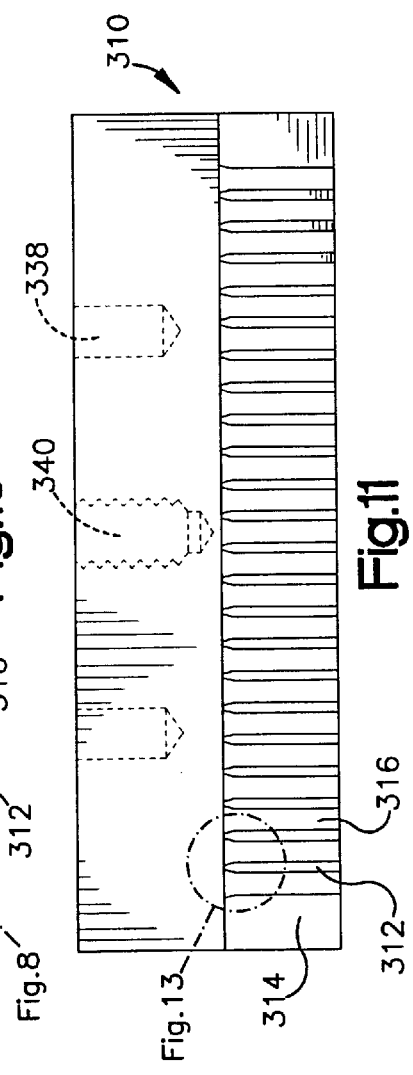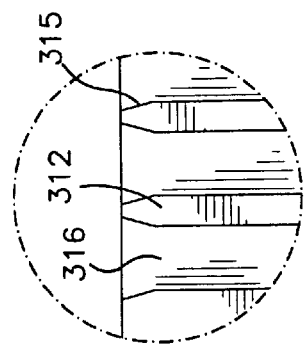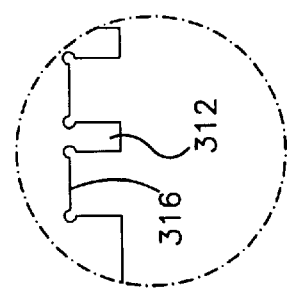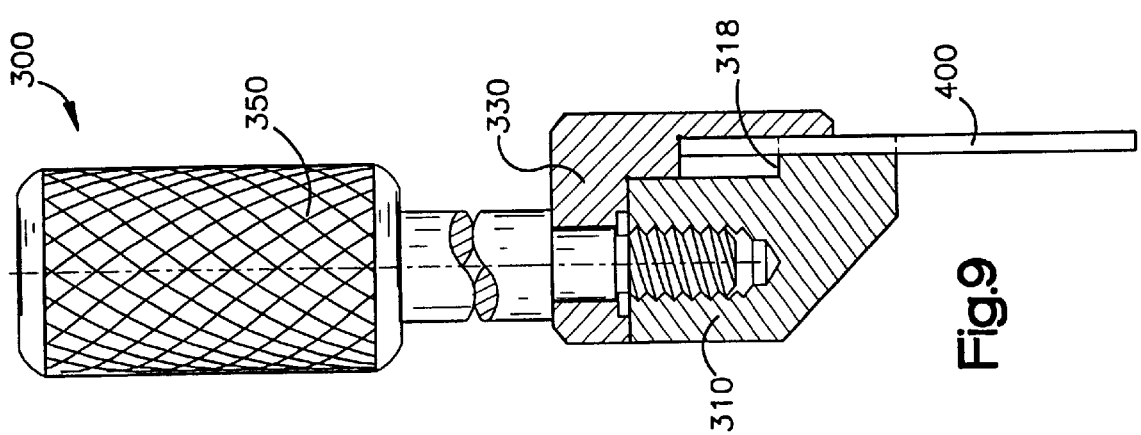

DAMBAR PUNCH SETUP JIG

TECHNICAL FIELD

The present invention generally relates to semiconductor packaging, and in particular to a device useful in changing dambar punches.

BACKGROUND OF THE INVENTION

ICs in die form are rather delicate. Usually, they are packaged by encapsulation in plastic with external metal leads. The process begins by placing the IC die on a dap of a metal lead frame. FIG. 1 illustrates a typical leadframe 100 with daps 110. The IC die is connected to leads 120, with soldered wires for example. At this stage of the process, leads 120 are connected by dambars 130. To encapsulate the die, two halves of a plastic mold are placed around the IC die and the mold is filled with a liquid plastic precursor. As illustrated in FIG. 2, dambars 130 retain plastic 140 within mold 150 while plastic 140 is curing. That portion of plastic 160 that solidifies between leads 120 next to the dambars 130 is referred to as "flash."

After the plastic solidifies, the mold is taken away and the dambars and flash are removed. The dambars and flash may be removed together or in separate steps. In either case, the dambars are usually removed by dambar punches. All the dambars may be punched out at once, or they may be punched out in several groups. Typically, half the dambars are removed in one punch step and the remaining dambars are removed in another. Dambar punches are produced for specific IC packages since lead count, lead pitches, and package sizes vary among different IC packages.

Dambar punches wear through use and must be replaced periodically. As pitch sizes get smaller, so do the dambar punches, making them ever smaller and more susceptible to wear. Worn punches cause dambar burr on the leads. Replacement of dambar punches is a time consuming process. Many dambar punches are required for high lead count packages and the dambar punches are small and difficult to handle. The dambar punches are ordinarily installed by hand, one at a time, using tweezers. In a typical situation, replacing a set of dambar punches in this manner takes half an hour. During this time, expensive automated IC packaging equipment remains idle, significantly impacting the manufacturing cost of IC packages. There is an unsatisfied need for a device and or method that reduces the time required to install a plurality of dambar punches in a dambar punch housing.

SUMMARY OF THE INVENTION

The invention provides a device, a dambar punch setup jig, which permits dambar punches to be rapidly installed in a dambar punch housing. The dambar punches are placed in the dambar punch setup jig, where their positions are fixed relative to one another. The dambar punches may be held in place on the dambar punch setup jig by a cover. Once installed in the dambar punch setup jig, the dambar punches can be simultaneously installed in a dambar punch housing. The dambar punch setup jig may then be removed, leaving the dambar punches installed in the dambar punch housing. The dambar punches are easier to install in the dambar punch setup jig then in the dambar punch housing, saving operator time. Using the jig substantially reduces the equipment downtime required to replace the dambar punches.

In one aspect, the invention provides a dambar punch setup jig including a body for holding a plurality of dambar punches, wherein the body is shaped so that dambar punches held by the body can be substantially installed in a dambar punch housing without releasing them from the body.

In another aspect, the invention provides a dambar punch setup jig including means for holding dambar punches and means for installing the held dambar punches in a dambar punch housing without releasing the dambar punches.

In a further aspect, the invention provides a method of installing a plurality of dambar punches in a dambar punch housing including the steps of placing the dambar punches in a module that holds the dambar punches, substantially installing the dambar punches in the dambar punch housing while the dambar punches are held by the module, and releasing the dambar punches from the module without de-installing the dambar punches from the dambar punch housing.

In a further aspect, the invention provides a method of removing a plurality of dambar punches from a dambar punch housing including the steps of installing a module around the dambar punches that holds the dambar punches and removing the module and dambar punches from the dambar punch housing as a unit.

BRIEF DESCRIPTION OF THE DRAWINGS

FIG. 9 is a cross-sectional side view illustration of the dambar punch setup jig of FIG. 7 holding dambar punches.

FIG. 10 is a top view illustration of the body of the dambar punch setup jig of FIGS. 7–9.

FIG. 11 is a front view illustration of the body of a dambar punch setup jig taken along the line 11 of FIG. 10.

FIG. 12 is an enlarged view of a portion of FIG. 10.

FIG. 13 is an enlarged view of a portion of FIG. 11.

DETAILED DESCRIPTION OF THE INVENTION

Figure 1:
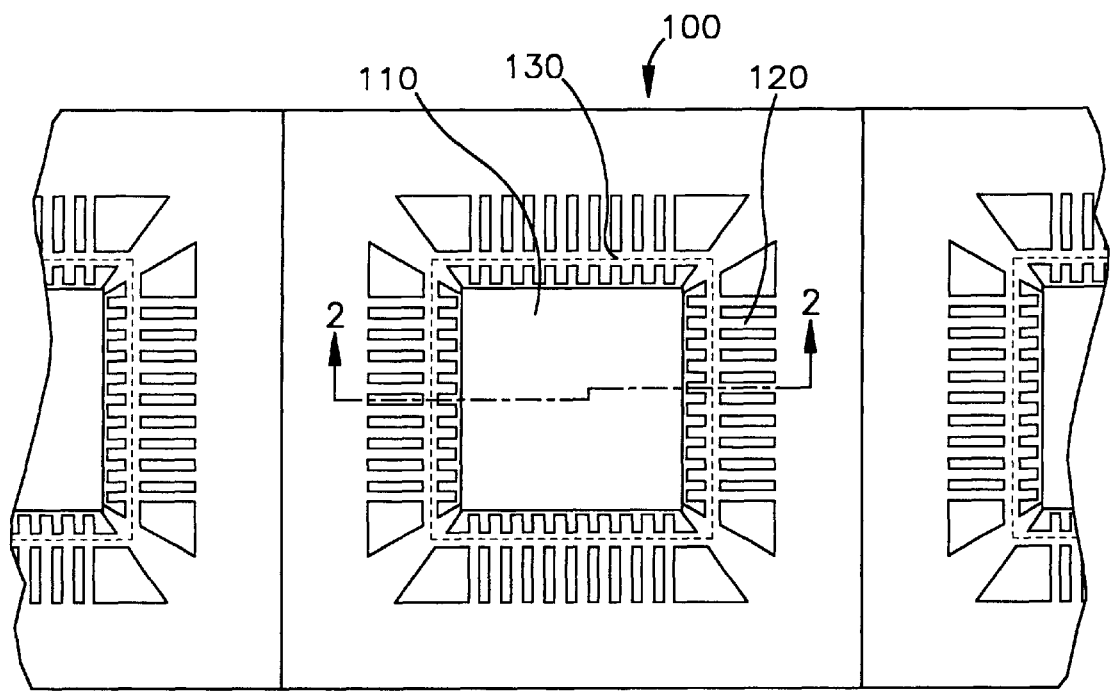
FIG. 1 is an illustration of a lead frame strip.
Figure 2:
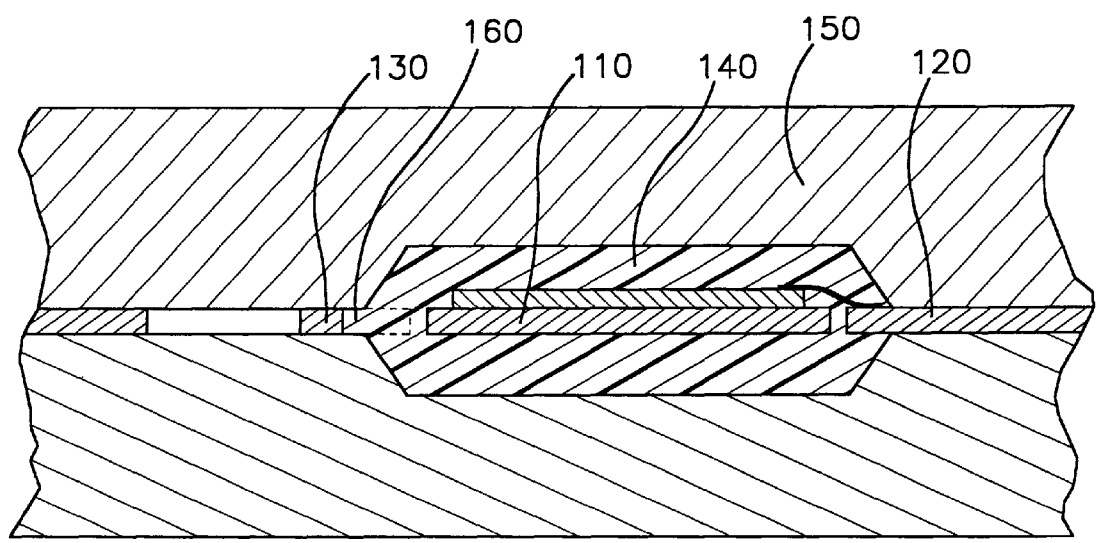
FIG. 2 is a cross-sectional illustration of the lead frame of FIG. 1 along line 2, with an IC die mounted on the lead frame and the lead frame and die placed within a mold.
Figure 3:
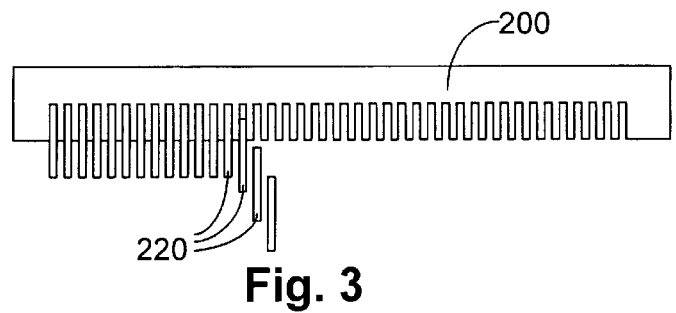
FIG. 3 is a schematic of dambar punches being installed in a dambar punch setup jig.
Figure 4:
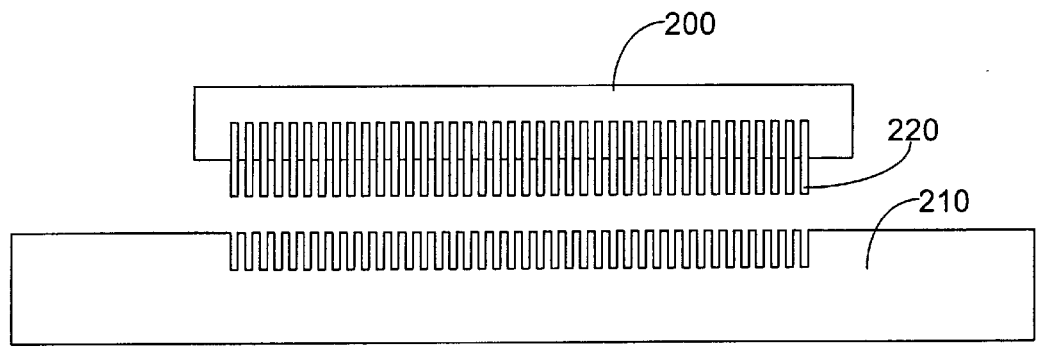
FIG. 4 is a schematic of dambar punches held by a dambar punch setup jig and about to be installed in a dambar punch housing.
Figure 5:
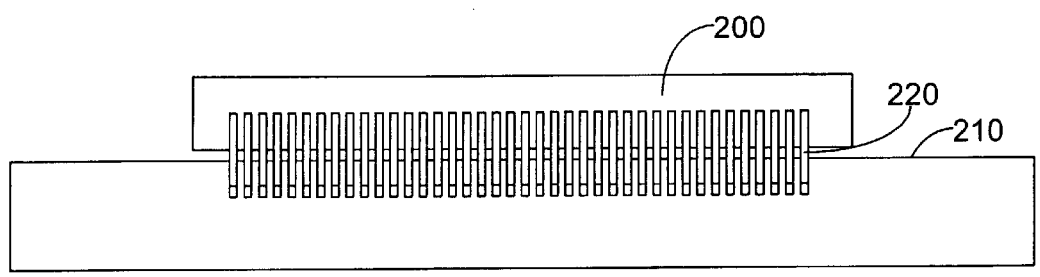
FIG. 5 is a schematic of dambar punches installed in a dambar punch housing while still held in a dambar punch setup jig.
Figure 6:
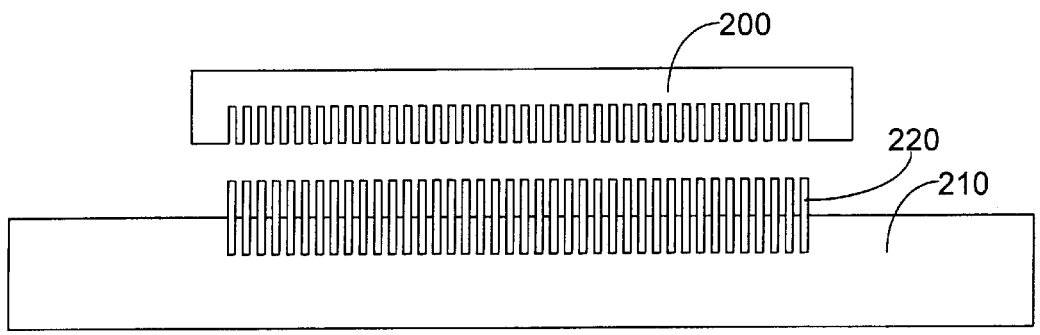
FIG. 6 is a schematic of dambar punches installed in a dambar punch housing.

According to one aspect of the invention, illustrated by FIGS. 3–6, a dambar punch setup jig 200 is used to efficiently install dambar punches 220 in a dambar punch housing 210. As illustrated by FIG. 3, dambar punches 220 are first installed in dambar punch setup jig 200. FIG. 4 illustrates dambar punch setup jig 200 positioning dambar punches 220 for installation in dambar punch housing 210. FIG. 5 illustrates dambar punches 220 being simultaneously substantially installed in dambar punch housing 210 without being removed from dambar punch setup jig 200. FIG. 6 illustrated that dambar punches 220 remain installed in dambar punch housing 210 after removal of dambar punch setup jig 200.

FIGS. 7–13 illustrate a dambar punch setup jig 300 according to one aspect of the present invention. Dambar punch setup jig 300 includes body 310, cover 330, and locking screw 350. Body 310 has ridges 312 running along one side. Dambar punches 400 fit snugly into slots 316 formed by ridges 312. Cover 330 holds dambar punches 400 in slots 316 during installation of dambar punches 400 in a dambar punch housing. Locking screw 350 secures cover 330 on body 310. After insertion of dambar punches 400 into a dambar punch housing, locking screw 350 is unlocked and cover 330 is removed. Body 310 may then be slid off dambar punches 400 and removed from the dambar punch housing.

The dambar punch housing may be part of any device that uses a plurality of separate dambar punches to remove dambars from lead frames. The dambar punch housing may be part of an intergrated system that performs deflash, trim, form, and singulation processes. Dambar punch housings and integrated systems including dambar punch housings are commercially available from several manufacturers.

Figures 7, 8:
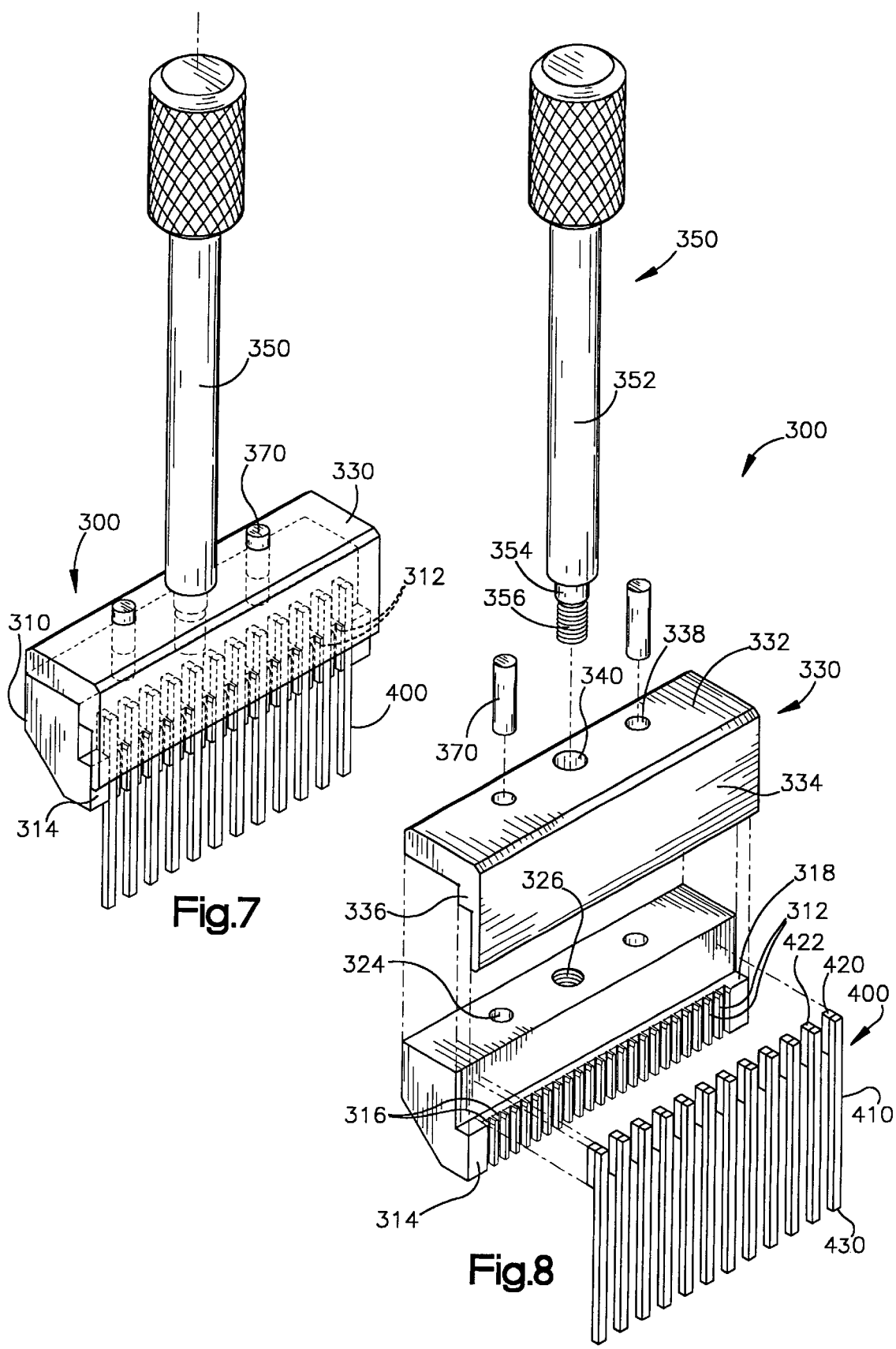
FIG. 7 is an oblique view illustration of dambar punches held in a dambar punch setup jig.
FIG. 8 is an exploded view of the damber punch setup jig and dambar punches of FIG. 7.

The dambar punches may have any shape suitable for cutting dambars. The dambar punches may be shaped to also cut away flash. FIGS. 7 and 8 illustrates typical dambar punches 400. Dambar punches 400 are L-shaped in that they have a narrow shaft 410 and a wider, offset portion 420 (the head) at one end of shaft 410. The cutting surface 430 is at the other end of shaft 410, opposite head 420. Shaft 410 is generally rectangular in cross-section, although it could be oval or some other shape.

Body 310 has a face 314 with ridges 312. Ridges 312 form slots 316. Dambar punches 400 fit snugly into slots 316, although dambar punches 400 are considerably longer than slots 316. Instead of ridges, face 314 may have other protrusions, such as pins, with the dambar punches fitting snugly between the pins.

Body 310 has ledge 318 formed by a face at right angles to face 314. When shafts 410 of dambar punches 400 are fit into slots 316 and heads 420 of dambar punches 400 are pushed against ledge 318, the positions of dambar punches 400 are fixed relative to one another. Slots 316 and ledge 318 together form receptacles for dambar punches 400. When dambar punches 400 are in these receptacles, they have the same relative positions as the do when properly installed in the dambar punch housing.

Dambar punches 400 can be easily fit into the receptacles of body 310. It is easier to maneuver dambar punches 400 into the receptacles of body 310 than it is to maneuver them into place directly into a dambar punch housing in part because there are fewer obstacles in the way and in part because there are more permissible angles and orientations for the dambar punches as they are guided into the receptacles of body 310 than there are when they are guided into a dambar punch housing. The ease of installing dambar punches in dambar setup jig 300 is further facilitated by beveling at the tops 315 of ridges 312, as illustrated by FIG. 13. The beveling makes slots 316 wider and more accessible at the end adjacent ledge 318.

Cover 330 fits over body 310 and holds dambar punches 400 in position when dambar punches 400 are installed in the receptacles of body 310. The particular shape of the cover is not important as long as long as it holds dambar punches 400 within the receptacles of body 310 during installation of dambar punches 400 in a dambar punch housing. A cover is not necessary if dambar punches 400 are otherwise effectively held in receptacles of the body. For example, dambar punches 400 could be held in place magnetically or by snapping into receptacles of body 310.

Cover 330 has a top portion 332 that fits against the top surface 322 of body 310 and a side portion 334 that fits over dambar punches 400 in slots 316 of body 310. Cover 330 also has a block 336 within the angle formed by top portion 332 and side portion 334. Block 336 fits against the tops 422 of heads 420 of dambar punches 400 when dambar punches 400 are with the receptacles of body 310.

Cover 330 is guided into position on body 310 by pins 370, which fit into holes 324 of body 310 and holes 338 of cover 330. Pins 370 may be permanently attached to body 310 or cover 330, but do not have to be permanently attached to either. Without pins, body 310 and cover 330 could be otherwise shaped to guide cover 330 into position on body 310. For example, cover 330 could fit closely around the front, sides, and back of body 310.

Locking screw 350 holds cover 330 in position over body 310. Locking screw 350 passes through aperture 340 of cover 330 and screws into matching threads in hole 326 formed into body 310. The shaft 352 of locking screw 350 broadens at point 354 from a cross section that fits through aperture 340 to one that does not. Thereby, as threads 356 of locking screw 350 are threaded into the matching threads of hole 326, cover 330 is pressed against body 310.

A locking screw is not required. For example, cover 330 could otherwise be held against body 310 such as by clips, by magnets, or by an arrangement of pins. Cover 330 could also simply slide into place on body 310.

After dambar punches 400 are placed in the receptacles of body 310, cover 330 is placed over body 310 to hold dambar punches 400 in place. Subsequently, cover 330 is secured in position on body 310 by locking screw 350.

While held by dambar punch setup jig 300, dambar punches 400 can be simultaneously installed in a dambar punch housing. The shafts 410 of dambar punches 400 protrude from dambar punch setup jig 300 and can be received by the dambar punch housing without removing dambar punches 400 from dambar punch setup jig 300.

Once dambar punches 400 are placed within the dambar punch housing, dambar punch setup jig 300 can optionally be removed leaving dambar punches 400 within the dambar punch housing. Dambar punch setup jig 300 can be removed by unscrewing screw 350, removing cover 330, and sliding body 310 away from dambar punches 400. Dambar punches 400 may drop or slide further into the dambar punch housing once body 310 is removed.

A dambar punch setup jig can also be designed to remove the dambar punches from a dambar punch housing. For example, the body of a dambar punch setup jig can be slid against dambar punches 400, a cover installed to secure dambar punches 400 within receptacles on the body, and the set of dambar punches simultaneously removed. As in the case of installation, the dambar punches may be removed in sets, rather than all at once.

What has been described above is the present invention and several of its specific aspects. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A dambar punch setup jig, comprising:

a body for holding a plurality of dambar punches, wherein the body is shaped so that the dambar punches held by the body can be substantially installed in a dambar punch housing without releasing them from the body and wherein the body has a plurality of receptacles for receiving the dambar punches;

a cover that fits on the body, wherein the cover holds the dambar punches within the receptacles, wherein the receptacles receive L-shaped dambar punches; and wherein the body has a ledge that the dambar punches can hang off as they are installed in the receptacles.

2. The dambar punch setup jig of claim 1, wherein the plurality of receptacles are positioned relative to one another such that when dambar punches are installed in the receptacles they have the same relative positions that they have when installed in a dambar punch housing.

3. The dambar punch setup of claim 1, wherein the receptacles comprise the ledge and a series of protrusions on a face adjacent the ledge.

4. The dambar punch setup jig of claim 3, wherein the series of protrusions form a series of slots into which the dambar punches fit.

5. The dambar punch setup jig of claim 4, wherein the protrusions are beveled adjacent the ledge so that the slots widen adjacent the ledge.

6. The dambar punch setup jig of claim 1, wherein dambar punches can be installed in the receptacles of the body more easily than they can be installed in a dambar punch housing.

7. The dambar setup jig of claim 1, wherein the cover is secured in position on the body by a locking screw.

8. A method of installing a plurality of dambar punches in a dambar punch housing, comprising:

placing the dambar punches in a module that holds the dambar punches;

substantially installing the dambar punches in the dambar punch housing while. the dambar punches are held by the module;

releasing the dambar punches from the module without deinstalling the dambar punches from the dambar punch housing, wherein the module fixes positions of the dambar punches relative to one another in the same relationship that the dambar punches have when properly installed in the dambar punch housing; and wherein the module comprises a body and a cover and the step of placing the dambar punches in a module includes first placing the dambar punches in the body and then installing the cover to hold the dambar punches in the body.

9. The method of claim 8, further comprising the step of attaching the installed cover to the body.

10. The method of claim 9, wherein the step of releasing the dambar punches from the module comprises removing the cover from the body and then removing the body from the dambar punches.

11. The method of claim 8, further comprising utilizing the dambar punches when properly installed in the dambar punch housing to remove flash.

12. The method of claim 8, further comprising utilizing the dambar punches when properly installed in the dambar punch housing to remove dambars from lead frames.

* * * * *